United States Patent
Song et al.

(10) Patent No.: US 10,601,026 B2
(45) Date of Patent: Mar. 24, 2020

(54) METHOD OF MANUFACTURING NEGATIVE ELECTRODE AND NEGATIVE ELECTRODE

(71) Applicant: LG Chem, Ltd., Seoul (KR)

(72) Inventors: Jun Hyuk Song, Daejeon (KR); Eun Kyung Kim, Daejeon (KR); Ju Ho Chung, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 15/740,048

(22) PCT Filed: Feb. 13, 2017

(86) PCT No.: PCT/KR2017/001517
§ 371 (c)(1),
(2) Date: Dec. 27, 2017

(87) PCT Pub. No.: WO2017/142261
PCT Pub. Date: Aug. 24, 2017

(65) Prior Publication Data
US 2018/0342727 A1    Nov. 29, 2018

(30) Foreign Application Priority Data

Feb. 15, 2016 (KR) .................. 10-2016-0017214
Feb. 7, 2017 (KR) .................. 10-2017-0016846

(51) Int. Cl.
*H01M 4/04* (2006.01)
*H01M 4/133* (2010.01)
(Continued)

(52) U.S. Cl.
CPC ...... *H01M 4/0404* (2013.01); *G01R 31/3865* (2019.01); *H01M 4/043* (2013.01);
(Continued)

(58) Field of Classification Search
CPC ...... H01M 4/04; H01M 4/0404; H01M 4/043; H01M 4/587; H01M 4/133; H01M 4/1393; H01M 10/0525
See application file for complete search history.

(56) References Cited

U.S. PATENT DOCUMENTS

2004/0115117 A1   6/2004  Takei et al.
2005/0221185 A1  10/2005  Sakata et al.
(Continued)

FOREIGN PATENT DOCUMENTS

JP        4448279 B2     4/2010
JP     2012248544 A    12/2012
(Continued)

OTHER PUBLICATIONS

Extended European Search Report for Application No. EP17753422.9 dated Mar. 14, 2018.
(Continued)

*Primary Examiner* — Karie O'Neill Apicella
(74) *Attorney, Agent, or Firm* — Lerner, David, Littenberg, Krumholz & Mentlik, LLP (57) ABSTRACT

The present invention relates to a method of manufacturing a negative electrode and a negative electrode manufactured using the method. According to the present invention, negative electrode samples are fabricated to have different electrode densities, and then, in a negative electrode expansion curve of each negative electrode sample according to the $1^{st}$ charging, when a change in slopes of tangents to the negative electrode expansion curve at an initial state of charge (SOC) of less than 50%, at which the expansion curve increases, satisfies a particular value, a secondary battery manufactured including a negative electrode having the electrode density may exhibit excellent lifespan characteristics and excellent initial efficiency for the corresponding active material.

11 Claims, 2 Drawing Sheets

(51) Int. Cl.
  *H01M 4/1393* (2010.01)
  *H01M 4/587* (2010.01)
  *H01M 10/0525* (2010.01)
  *G01R 31/385* (2019.01)
  *H01M 4/02* (2006.01)

(52) U.S. Cl.
  CPC ......... *H01M 4/133* (2013.01); *H01M 4/1393* (2013.01); *H01M 4/587* (2013.01); *H01M 10/0525* (2013.01); *H01M 2004/021* (2013.01); *H01M 2004/027* (2013.01)

(56) References Cited

U.S. PATENT DOCUMENTS

| | | |
|---|---|---|
| 2007/0128518 A1 | 6/2007 | Uono et al. |
| 2010/0297500 A1 | 11/2010 | Kawai et al. |
| 2011/0045354 A1 | 2/2011 | Takei et al. |
| 2013/0078529 A1* | 3/2013 | Yang ................. H01M 10/0567 429/326 |
| 2013/0212875 A1 | 8/2013 | Takahata et al. |
| 2017/0025706 A1 | 1/2017 | Dahn et al. |

FOREIGN PATENT DOCUMENTS

| | | |
|---|---|---|
| JP | 2014082157 A | 5/2014 |
| KR | 20080075039 A | 8/2008 |
| KR | 20090016462 A | 2/2009 |
| KR | 20130126273 A | 11/2013 |
| WO | 2015153716 A1 | 10/2015 |

OTHER PUBLICATIONS

Search report from International Application No. PCT/KR2017/001517, dated May 18, 2017.

* cited by examiner

METHOD OF MANUFACTURING NEGATIVE ELECTRODE AND NEGATIVE ELECTRODE

CROSS-REFERENCE TO RELATED APPLICATION

The present application is a national phase entry under 35 U.S.C. § 371 of International Application No.: PCT/KR2017/001517 filed on Feb. 13, 2017, which claims priority from Korean Patent Application Nos. 10-2016-0017214, filed on Feb. 15, 2016, and 10-2017-0016846, filed on Feb. 7, 2017, the disclosures of which are incorporated herein by reference.

TECHNICAL FIELD

The present invention relates to a method of manufacturing a negative electrode and a negative electrode manufactured using the method.

BACKGROUND ART

Due to a rapid increase in the use of fossil fuels, there is an increasing demand for the use of alternative energy or clean energy, and thus research into power generation and energy accumulation fields is being most actively conducted.

As a representative example of electrochemical devices using such electrochemical energy, secondary batteries are currently used and use thereof tends to gradually expand. Recently, in line with an increase in development of technology for portable devices, such as portable computers, mobile phones, cameras, and the like, and demand therefor, demand for secondary batteries as energy sources is rapidly increasing. Among such secondary batteries, much research into lithium secondary batteries, which have high energy density, high operating voltage, long cycle lifespan, and a low self-discharge rate, has been conducted, and such lithium secondary batteries are commercially available and widely used.

Generally, a secondary battery consists of a positive electrode, a negative electrode, and an electrolyte. In the secondary battery, energy transfer occurs while lithium ions reciprocate between opposite electrodes such that, through I' charging, lithium ions from a positive electrode active material are intercalated into a negative electrode active material such as carbon particles and, during discharging, the lithium ions are deintercalated, and, in this way, the secondary battery can be charged and discharged.

For example, a lithium secondary battery has a structure in which an electrode assembly, including a positive electrode including a lithium transition metal oxide as an electrode active material, a negative electrode including a carbon-based active material, and a porous separator, is impregnated with a lithium electrolyte. The positive electrode is manufactured by coating aluminum (Al) foil with a positive electrode mixture including a lithium transition metal oxide, and the negative electrode is manufactured by coating copper (Cu) foil with a negative electrode mixture including a carbon-based active material.

Meanwhile, to achieve high capacity of the secondary battery, while performance such as lifespan, resistance, and the like is maintained at the same level, it is necessary to realize a high-density electrode to utilize a negative electrode active material as much as possible within unit volume.

Conventionally, there have been attempts to realize a high-density electrode by pressing a negative active material to the maximum extent without considering physical properties thereof, which results in peeling, cracks, or the like of the active material, thus causing a resistance increase and deterioration of lifespan characteristics.

Therefore, there is a need to develop a method of improving battery performance via realization of electrode density that enables optimum performance according to the type of negative electrode active material.

DISCLOSURE

Technical Problem

It is the first technical goal of the present invention to provide a method of manufacturing a negative electrode, in which an optimum electrode density according to the type of negative electrode material is obtained by measuring expansion curves of a plurality of negative electrode samples, and, accordingly, a secondary battery with both excellent efficiency and excellent lifespan characteristics may be obtained.

It is the second technical goal of the present invention to provide a negative electrode manufactured using the above-described method.

It is the third technical goal of the present invention to provide a secondary battery, a battery module, and a battery pack that include the above-described negative electrode.

Technical Solution

The prevent invention provides a method of manufacturing a negative electrode, including: a first process of fabricating a plurality of negative electrode samples including active material layers having the same composition and having different electrode densities; a second process of measuring a negative electrode expansion curve of each negative electrode sample according to a state of charge (SOC) at a $1^{st}$ charging cycle; a third process of measuring a difference between slopes of tangents to the curve at x−5 and x+5, assuming that a SOC value, at which a slope of a tangent to the measured negative electrode expansion curve is 1, is x where x<50; a fourth process of selecting an optimum electrode density such that the measured slope difference satisfies a range of 0 to 0.5; and a fifth process of manufacturing a negative electrode under conditions satisfying the selected optimum electrode density.

The present invention also provides a negative electrode manufactured using the above-described method, and the negative electrode may include, as an active material, graphite having a low degree of graphitization and consisting of secondary particles and have an electrode density of 1.3 g/cc to 1.5 g/cc.

The present invention also provides a negative electrode manufactured using the above-described method, and the negative electrode may include, as an active material, graphite having a high degree of graphitization and consisting of secondary particles and have an electrode density of 1.4 g/cc to 1.7 g/cc.

The present invention also provides a secondary battery including the negative electrode, a positive electrode, a separator between the negative electrode and the positive electrode, and an electrolyte, and a battery module and a battery pack that include the secondary battery as a unit cell.

Advantageous Effects

According to the present invention, a negative electrode is manufactured by fabricating a plurality of negative electrode samples including active material layers having the same composition to have different electrode densities, measuring a negative electrode expansion curve of each negative electrode sample according to the $1^{st}$ charging cycle, and obtaining an optimum electrode density of the corresponding composition by using the negative electrode expansion curve, and a secondary battery with excellent lifespan characteristics and excellent initial efficiency can be manufactured using the negative electrode.

BEST MODE

Hereinafter, the present invention will be described in more detail to aid in understanding of the present invention.

The terms or words used in the present specification and claims should not be construed as being limited to ordinary or dictionary meanings and should be construed as meanings and concepts consistent with the spirit of the present invention based on a principle that an inventor can appropriately define concepts of terms to explain the invention of the inventor in the best way.

The terminology used herein is provided for describing exemplary embodiments only and is not intended to limit the scope of the present invention. The singular forms are intended to include the plural forms, unless the context clearly indicates otherwise.

It is to be understood that the terms such as "comprising," "including," or "having" when used in this specification, specify the presence of stated features, numbers, steps, elements, or combinations thereof, but do not preclude the presence or addition of one or more other features, numbers, steps, elements, or combinations thereof.

In particular, a method of manufacturing a negative electrode, according to the present invention, includes: a first process of fabricating a plurality of negative electrode samples including active material layers having the same composition and having different electrode densities; a second process of measuring a negative electrode expansion curve of each negative electrode sample according to a state of charge (SOC) at the $1^{st}$ charging cycle; a third process of measuring a difference between slopes of tangents to the curve at x−5 and x+5, assuming that a SOC value, at which the slope of a tangent to the measured negative electrode expansion curve is 1, is x where x<50; a fourth process of selecting an optimum electrode density such that the measured slope difference satisfies a range of 0 to 0.5; and a fifth process of manufacturing a negative electrode under conditions satisfying the selected optimum electrode density.

Hereinafter, each process of the method of manufacturing a negative electrode, according to the present invention, will be described in detail.

First, a plurality of negative electrode samples including active material layers having the same composition and having different electrode densities, are fabricated (first process). In particular, a negative electrode may be manufactured by applying a negative electrode slurry prepared by mixing a negative electrode mixture including a negative electrode active material, a conductive material, and a binder with an organic solvent on a negative electrode current collector, and then drying and pressing the resulting negative electrode current collector. In this case, in the drying and pressing processes after applying the negative electrode slurry, electrode density may be adjusted.

Generally, a negative electrode expansion curve may vary according to the type of active material in a negative electrode, in particular, according to a powder compact density of the active material. An optimum electrode density according to the type of active material may be obtained when the method of the present invention is used, and a negative electrode with excellent lifespan characteristics and excellent initial efficiency may be manufactured using the optimum electrode density.

As used herein, the electrode density refers to the amount of a negative electrode mixture coated in the same volume.

The powder compact density refers to the amount of a negative electrode active material coated in the same volume when 3 g of the negative electrode active material is compressed with 1,000 kg under measurement conditions of a powder compact density of 10 mm. In addition, a negative electrode active material having a powder pressing density of 1.75 g/cc does not refer to a negative electrode active material obtained by compression treatment, but refers to a negative electrode active material having a physical property value, i.e., a pressing density of 1.75 g/cc, when the negative electrode active material is subjected to a compression treatment test.

Meanwhile, the active material layer may include an active material, a conductive material, and/or a binder, and the active material may include graphite-based active materials. Among these graphite-based active materials, in particular, natural graphite or artificial graphite is more preferably used due to the fact that, when lithium ions are intercalated into net planes of graphite, a staging phenomenon occurs, and, accordingly, a negative electrode expansion curve shows an S-shaped thickness expansion open form. For example, the active material layer may include, as an active material, graphite having a low degree of graphitization and consisting of secondary particles or graphite having a high degree of graphitization and consisting of secondary particles.

Meanwhile, in the first process, the fabricating of the plurality of negative electrode samples having different electrode densities may be performed, for example, by fabricating a plurality of negative electrode samples according to electrode density by varying the pressure during the fabrication of the negative electrode samples.

In particular, the negative electrode samples may be fabricated with an electrode density ranging from 1.3 g/cc to 1.8 g/cc. For example, the negative electrode samples may be fabricated by applying a negative electrode slurry prepared by mixing a negative electrode mixture including an active material, a conductive material, and a binder with an organic solvent on the negative electrode current collectors, and drying the resulting current collectors, followed by pressing at different pressures in the range of 200 kg/5 cm to 2,000 kg/5 cm, thereby completing the preparation of the negative electrode samples having different electrode densities. In this case, powder compact density characteristics are in proportion to electrode density characteristics. However, in the method of manufacturing negative electrodes according to different electrode densities, the electrode densities of negative electrodes and the type of negative electrode active materials are not limited to the above examples. In this regard, a negative electrode active material for manufacturing a negative electrode is selected, and then the plurality of negative electrode samples having different electrode densities are manufactured, thereby obtaining an optimum negative electrode density according to the type of negative electrode active material.

The conductive material is not particularly limited as long as it does not cause any chemical change in the fabricated battery and has conductivity. Non-limiting examples of the conductive material include graphite such as natural graphite or artificial graphite; carbon black such as carbon black, acetylene black, Ketjen black, channel black, furnace black, lamp black, or thermal black; conductive fibers such as carbon fibers or metal fibers; conductive tubes such as carbon nanotubes; metal powders of fluorocarbon, aluminum, or nickel; conductive whiskers of zinc oxide or potassium titanate; conductive metal oxides such as titanium oxide; and polyphenylene derivatives. In particular, acetylene black may be used as the conductive material.

The binder may include various types of binder polymers such as a polyvinylidenefluoride-hexafluoropropylene copolymer (PVDF-co-HFP), polyvinylidenefluoride, polyacrylonitrile, polymethylmethacrylate, polyvinyl alcohol, carboxymethylcellulose (CMC), starch, hydroxypropylcellulose, regenerated cellulose, polyvinylpyrrolidone, tetrafluoroethylene, polyethylene, polypropylene, polyacrylic acid, ethylene-propylene-diene monomers (EPDMs), sulfonated EPDMs, styrene-butadiene rubber (SBR), fluorine rubber, poly acrylic acid, polymers obtained by substituting hydrogen atoms of the aforementioned materials with Li, Na, Ca, or the like, and various copolymers. In particular, CMC and SBR may be used as the binder.

Next, a negative electrode expansion curve of each of the negative electrode samples manufactured in the first process according to the SOC at the $1^{st}$ charging cycle is measured (second process).

In particular, to measure an expansion curve of each of the plurality of negative electrode samples having different electrode densities manufactured in the first process, a coin-type half secondary battery including each negative electrode sample may be manufactured. For example, the coin-type half secondary battery may be manufactured by manufacturing an electrode assembly by interposing a separator between metal lithium foil as a positive electrode and each negative electrode sample manufactured in the first process as a negative electrode; and injecting an electrolyte into the electrode assembly.

As described above, a coin-type half secondary battery including each negative electrode sample manufactured in the first process is manufactured, and then charged and negative electrode expansion curves showing changes in the thickness of a negative electrode according to the SOC during charging may be measured.

In this case, the SOC and the changes in the thickness of a negative electrode may be measured using a real-time thickness measurement method through a spring-type real-time displacement measurement device.

Next, a difference between slopes of tangents to the curve at x−5 and x+5, assuming that a SOC value, at which the slope of a tangent to the measured negative electrode expansion curve is 1, is x where x<50, is measured (third process).

Among the negative electrode expansion curves measured in the second process, an optimum electrode density may be obtained via a section where the SOC value is less than 50%.

For example, when a section where the SOC value is greater than 50% is analyzed, a change in slope is not sharp but constant, and thus it is difficult to analyze characteristics according to the slope.

For example, assuming that the SOC value, at which the slope of a tangent to the measured negative electrode expansion curve is 1 at the SOC of less than 50%, is 25%, a slope of the expansion curve at the SOC of 20% may be denoted as g(20), a slope of the expansion curve at the SOC of 30% may be denoted as g(30), and a difference between the slopes of the curve may be denoted as g(20)-g(30).

Subsequently, an optimum electrode density is selected such that the measured slope difference satisfies a range of 0 to 0.5 (fourth process).

For example, wherein the measured slope difference is greater than 0.5, an electrode is over-compressed, and thus initial efficiency is low and lifespan characteristics deteriorate, resulting in the occurrence of severe swelling.

Thus, when the difference between the slopes of the curve ranges from 0 to 0.5, an optimum electrode density corresponding to a particular negative electrode active material is obtained, and thus problems, such as deterioration of lifespan characteristics, an increase in resistance, and the like due to peeling of or cracks in an active material occurring when the electrode density is high, may be prevented. In addition, problems such as a reduction in capacity of a battery, and the like occurring when the electrode density is low may be prevented.

Lastly, a negative electrode is manufactured under conditions satisfying the selected optimum electrode density (fifth process).

When satisfying the selected optimum electrode density as described above, a negative electrode with both excellent lifespan characteristics and excellent efficiency and capacity characteristics may be manufactured, and a second battery with excellent lifespan characteristics and high efficiency may be manufactured using the negative electrode. The secondary battery may include the negative electrode, a positive electrode, a separator between the negative electrode and the positive electrode, and an electrolyte.

In this case, the negative electrode may be manufactured by the same process as that of manufacturing negative electrode samples (first process). In particular, the negative electrode may be manufactured by preparing a negative electrode slurry by mixing a negative electrode mixture including an active material, a conductive material, and a binder with an organic solvent, applying the negative electrode slurry on a current collector, and drying and pressing the resulting current collector.

In particular, the negative electrode may include, as the active material, graphite having a low degree of graphitization and consisting of secondary particles or graphite having a high degree of graphitization and consisting of secondary particles.

When graphite having a low degree of graphitization and consisting of secondary particles is used as the negative electrode active material, the negative electrode may have an optimum electrode density of 1.3 g/cc to 1.5 g/cc. When the electrode density of the negative electrode including graphite having a low degree of graphitization and consisting of secondary particles as an active material is less than 1.3 g/cc, a battery including the electrode has poor lifespan characteristics and low initial efficiency, and thus is not suitable for use. When the electrode density is greater than 1.5 g/cc, the electrode is over-compressed, resulting in an increase in resistance or deterioration of lifespan characteristics.

When graphite having a high degree of graphitization and consisting of secondary particles is used as the negative electrode active material, the negative electrode may have an optimum electrode density of 1.4 g/cc to 1.7 g/cc. When the electrode density of the negative electrode including graphite having a high degree of graphitization and consisting of secondary particles as an active material is less than 1.4 g/cc, a battery including the electrode has poor lifespan characteristics and low initial efficiency, and thus is not suitable for use. When the electrode density is greater than 1.7 g/cc, the electrode is over-compressed, resulting in an increase in resistance or deterioration of lifespan characteristics.

In addition, the conductive material and the binder may be the same as those described above. In particular, the conductive material may include acetylene black, and the binder may include CMC and SBR.

The active material, the conductive material, and the binder may be included in a weight ratio of 95-95.5:0.5-1.5:3.5-4, in particular, a weight ratio of 95.3:1:3.7.

In addition, the positive electrode may be manufactured by applying a slurry prepared by mixing a positive electrode mixture including an active material, a conductive material, and a binder with an organic solvent on a current collector, and then drying and pressing the resulting current collector.

Examples of the positive electrode active material include, but are not limited to, a lithium nickel manganese composite oxide (LNMO); layered compounds such as lithium cobalt oxide ($LiCoO_2$) and lithium nickel oxide ($LiNiO_2$); a lithium transition metal composite oxide substituted with a transition metal such as $Li(Ni_aCo_bMn_c)O_2$ where $0<a<1$, $0<b<1$, $0<c<1$, and $a+b+c=1$; lithium manganese oxides such as $LiMnO_3$, $LiMn_2O_4$, and $LiMnO_2$; lithium copper oxide ($Li_2CuO_2$); vanadium oxides such as $LiV_3O_8$, $V_2O_5$, and $Cu_2V_2O_7$; $LiFe_3O_4$; lithium phosphates such as $LiFePO_4$, $LiCoPO_4$, and $LiFe_xMm_{1-x}PO_4$; Ni-site type lithium nickel oxides represented by the formula $LiN_{1-x}MxO_2$ where M is Co, Mn, Al, Cu, Fe, Mg, B, or Ga, and $0.01 \leq x \leq 0.3$; and lithium manganese composite oxides represented by the formula $LiMn_{2-x}MxO_2$ where M is Co, Ni, Fe, Cr, Zn, or Ta, and $0.01 \leq x \leq 0.1$ or $Li_2Mn_3MO_8$ where M is Fe, Co, Ni, Cu, or Zn.

The conductive material, the binder, and the like may be identical to or different from those used in the negative electrode active material.

In addition, the electrolyte may include a non-aqueous organic solvent and a metal salt.

The non-aqueous organic solvent may be, for example, an aprotic organic solvent such as N-methyl-2-pyrrolidinone, propylene carbonate, ethylene carbonate, butylene carbonate, dimethyl carbonate, diethyl carbonate, γ-butyrolactone, 1,2-dimethoxy ethane, tetrahydroxy franc, 2-methyltetrahydrofuran, dimethyl sulfoxide, 1,3-dioxolane, formamide, dimethylformamide, dioxolane, acetonitrile, nitromethane, methyl formate, methyl acetate, phosphoric acid triester, trimethoxy methane, dioxolane derivatives, sulfolane, methyl sulfolane, 1,3-dimethyl-2-imidazolidinone, propylene carbonate derivatives, tetrahydrofuran derivatives, ether, methyl propionate, ethyl propionate, or the like.

The metal salt may be a lithium salt, and the lithium salt may be a material that is readily soluble in the non-aqueous electrolyte, for example, LiCl, LiBr, LiI, $LiClO_4$, $LiBF_4$, $LiB_{10}Cl_{10}$, $LiPF_6$, $LiCF_3SO_3$, $LiCF_3CO_2$, $LiAsF_6$, $LiSbF_6$, $LiAlCl_4$, $CH_3SO_3Li$, $CF_3SO_3Li$, $(CF_3SO_2)_2NLi$, chloroborane lithium, lower aliphatic carboxylic acid lithium, lithium tetraphenylborate, imides, or the like.

The separator may be a porous polymer film commonly used in the art as a separator, for example, a porous polymer film formed of a polyolefin-based polymer, such as an ethylene homopolymer, a propylene homopolymer, an ethylene/butene copolymer, an ethylene/hexene copolymer, an ethylene/methacrylate copolymer, or the like, or a structure formed by stacking these porous polymer films. In addition, the separator may be a general porous non-woven fabric, for example, a non-woven fabric made of high melting point-glass fiber, polyethylene terephthalate fiber, or the like, but the present invention is not limited to the above examples.

According to another embodiment of the present invention, a battery module including the secondary battery as a unit cell and a battery pack including the same are provided. The battery module and the battery pack include the secondary battery with high capacity, high efficiency, and excellent lifespan characteristics, and thus may be used as power sources of medium to large sized devices selected from the group consisting of electric vehicles, hybrid electric vehicles, plug-in hybrid electric vehicles, and systems for storing power.

MODE OF THE INVENTION

Hereinafter, the present invention will be described in further detail with reference to the following examples such that the invention may be carried out by one of ordinary skill in the art to which the present invention pertains without undue difficulty. However, the present invention may be embodied in many different forms and these examples are not intended to limit the scope of the present invention.

Example 1

[Manufacture of Negative Electrode Sample]

Graphite having a powder compact density of 1.75 g/cc and a low degree of graphitization and consisting of secondary particles was prepared. A negative electrode mixture including 95.3 wt % of the graphite having a low degree of graphitization and consisting of secondary particles, 1 wt % of acetylene black-based carbon particles as a conductive material, and 3.7 wt % of CMC and SBR as a binder was added to N-methyl-2-pyrrolidone (NMP) as a solvent to prepare a negative electrode slurry. The negative electrode slurry was applied on Cu foil having a thickness of 10 μm as a negative electrode current collector and the resulting current collector was dried to manufacture a negative electrode sample, followed by roll pressing.

In this case, a loading amount of the negative electrode was 250 mg/25 $cm^2$ and the negative electrode sample was roll-pressed at 200 kg/5 cm so that the electrode density was 1.3 g/cc.

[Manufacture of Secondary Battery]

A secondary battery provided with a spring at an upper plate thereof to enable real-time thickness measurement according to the expansion of the negative electrode was manufactured using the negative electrode sample manufactured as above. A real-time displacement measurement device was installed on the upper plate and changes in thickness according to charging/discharging were measured.

In this case, a 1.8 $cm^2$ LCO-based positive electrode active material was used as a positive electrode, and a polyethylene separator was interposed between the negative electrode and the positive electrode to manufacture an electrode assembly. A non-aqueous electrolyte was prepared by adding 1M $LiPF_6$ to a non-aqueous electrolyte solvent in which ethylene carbonate and diethyl carbonate were mixed in a volume ratio of 1:2, and then injected into the electrode assembly, thereby completing the manufacture of a coin-type half secondary battery.

Example 2

A negative electrode and a secondary battery including the same were manufactured in the same manner as in Example 1, except that the negative electrode sample manufactured using, as an active material, graphite having a powder compact density of 1.75 g/cc and a low degree of graphitization and consisting of secondary particles was roll-pressed at 500 kg/5 cm to have an electrode density of 1.4 g/cc.

Example 3

A negative electrode and a secondary battery including the same were manufactured in the same manner as in Example 1, except that the negative electrode sample manufactured using, as an active material, graphite having a powder compact density of 1.75 g/cc and a low degree of graphitization and consisting of secondary particles was roll-pressed at 800 kg/5 cm to have an electrode density of 1.5 g/cc.

Example 4

A negative electrode and a secondary battery including the same were manufactured in the same manner as in Example 1, except that a negative electrode sample was manufactured using, as an active material, graphite having a powder compact density of 1.95 g/cc and a high degree of graphitization and consisting of secondary particles, and the negative electrode sample was roll-pressed at 200 kg/5 cm to have an electrode density of 1.4 g/cc.

Example 5

A negative electrode and a secondary battery including the same were manufactured in the same manner as in Example 1, except that a negative electrode sample was manufactured using, as an active material, graphite having a powder compact density of 1.95 g/cc and a high degree of graphitization and consisting of secondary particles, and the negative electrode sample was roll-pressed at 400 kg/5 cm to have an electrode density of 1.5 g/cc.

Example 6

A negative electrode and a secondary battery including the same were manufactured in the same manner as in Example 1, except that a negative electrode sample was manufactured using, as an active material, graphite having a powder compact density of 1.95 g/cc and a high degree of graphitization and consisting of secondary particles, and the negative electrode sample was roll-pressed at 700 kg/5 cm to have an electrode density of 1.6 g/cc.

Example 7

A negative electrode and a secondary battery including the same were manufactured in the same manner as in Example 1, except that a negative electrode sample was manufactured using, as an active material, graphite having a powder compact density of 1.95 g/cc and a high degree of graphitization and consisting of secondary particles, and the negative electrode sample was roll-pressed at 900 kg/5 cm to have an electrode density of 1.7 g/cc.

Comparative Example 1

A negative electrode and a secondary battery including the same were manufactured in the same manner as in Example 1, except that the negative electrode sample manufactured using, as an active material, graphite having a powder compact density of 1.75 g/cc and a low degree of graphitization and consisting of secondary particles was roll-pressed at 1,000 kg/5 cm to have an electrode density of 1.6 g/cc.

Comparative Example 2

A negative electrode and a secondary battery including the same were manufactured in the same manner as in Example 1, except that the negative electrode sample manufactured using, as an active material, graphite having a powder compact density of 1.75 g/cc and a low degree of graphitization and consisting of secondary particles was roll-pressed at 2,000 kg/5 cm to have an electrode density of 1.8 g/cc.

Comparative Example 3

A negative electrode and a secondary battery including the same were manufactured in the same manner as in Example 1, except that a negative electrode sample was manufactured using, as an active material, graphite having a powder compact density of 1.95 g/cc and a high degree of graphitization and consisting of secondary particles, and the negative electrode sample was roll-pressed at 1,200 kg/5 cm to have an electrode density of 1.8 g/cc.

Figure 1:
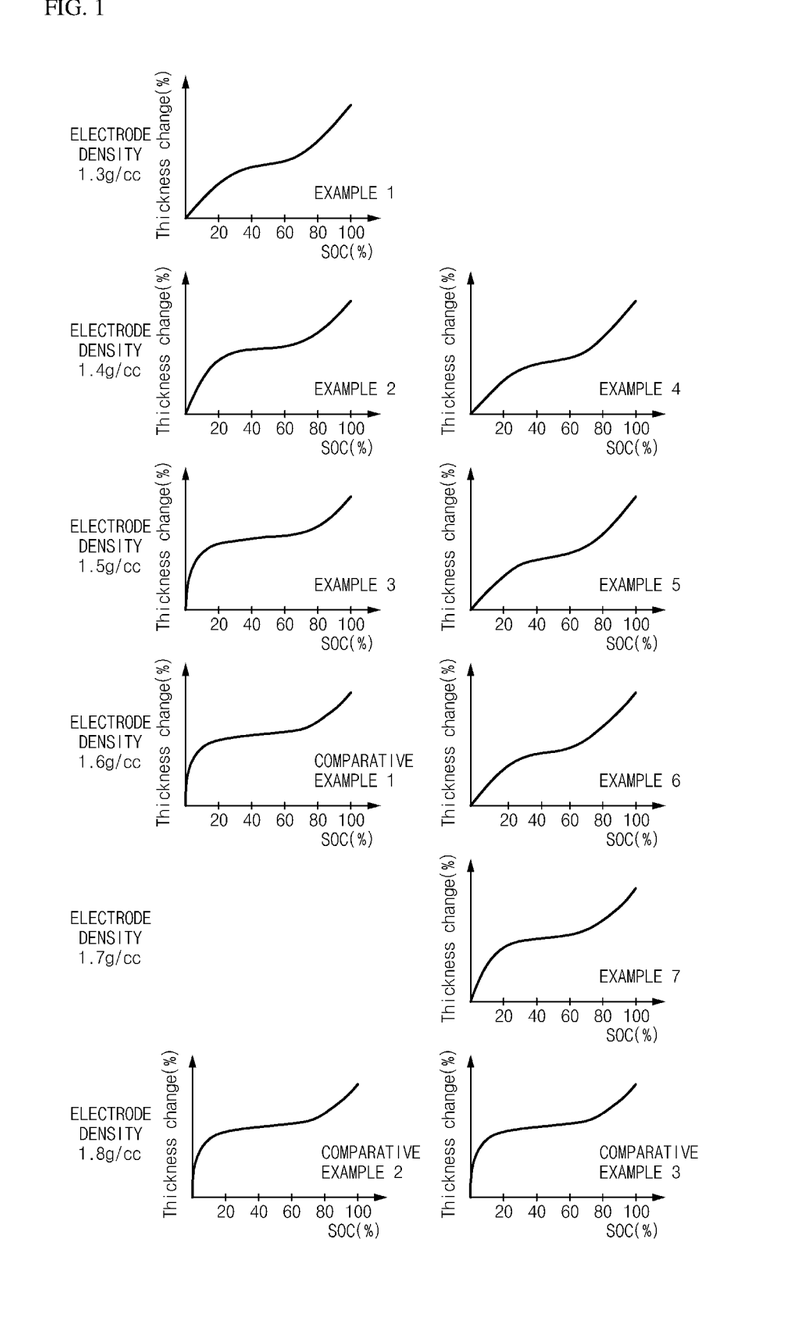
FIG. 1 illustrates graphs showing expansion curves of negative electrode samples manufactured according to Examples 1 to 7 and Comparative Examples 1 to 3.

Experimental Example 1: Measurement of Optimum Electrode Density Via Negative Electrode Expansion Curves Each of the coin-type half secondary batteries manufactured according to Examples 1 to 7 and Comparative Examples 1 to 3 was subjected to the Pt full charging cycle under conditions: charged at CC/CV, 0.2 C, and 5 mV and cut off at 0.005 C, and then negative electrode expansion curves for the $1^{st}$ full charging cycle are shown in FIG. 1. For example, as in Example 2, when the negative electrode had an electrode density of 1.4 g/cc, the SOC value, at which the slope of the curve is 1 at the SOC of less than 50%, was 25%, and, when this was denoted as g(25), a difference between slopes of tangents to the curve at g(20) and g(30) was measured as 0.1.

In Table 1 below, a difference between slopes of tangents to the negative electrode expansion curve of each of the coin-type half secondary batteries of Examples 1 to 7 and Comparative Examples 1 to 3 at x−5 and x+5, assuming that an SOC value, at which the slope of the tangent to the curve is 1 at the SOC of less than 50%, is x, is shown.

TABLE 1

| Type of negative electrode | SOC(x) at which slope of tangent is 1 at SOC of less than 50% | Difference between slopes of tangents to curve at x − 5 and x + 5 |
|---|---|---|
| Example 1 | 25 | 0.1 |
| Example 2 | 25 | 0.1 |
| Example 3 | 21 | 0.5 |

TABLE 1-continued

| Type of negative electrode | SOC(x) at which slope of tangent is 1 at SOC of less than 50% | Difference between slopes of tangents to curve at x − 5 and x + 5 |
|---|---|---|
| Comparative Example 1 | 12 | 0.9 |
| Comparative Example 2 | 12 | 1.2 |
| Example 4 | 24 | 0.2 |
| Example 5 | 24 | 0.2 |
| Example 6 | 24 | 0.2 |
| Example 7 | 19 | 0.5 |
| Comparative Example 3 | 15 | 1.1 |

From the results shown in Table 1, it was confirmed that, when graphite having a low degree of graphitization and consisting of secondary particles is used as an active material as in Examples 1 to 3 and Comparative Examples 1 and 2, the cases of Examples 1 to 3, in which the difference between slopes of tangents to the curve at x−5 and x+5 is 0.5 or less, are optimum electrode densities. In addition, in Example 3, the difference between slopes of tangents to the curve at x−5 and x+5 is 0.5, and, in Comparative Examples 1 and 2, the difference between slopes of tangents to the curve at x−5 and x+5 is greater than 0.5. From the results, an increase in resistance or deterioration of lifespan characteristics may be predicted due to over-compression of the negative electrode having an electrode density exceeding the electrode density of the case of Example 3.

In addition, it was confirmed that, when graphite having a high degree of graphitization and consisting of secondary particles is used as in Examples 4 to 6 and Comparative Example 3, the cases of Examples 4 to 6, in which the difference between slopes of tangents to the curve at x−5 and x+5 is 0.5 or less, are optimum electrode densities. In addition, in Example 7, the difference between slopes of tangents to the curve at x−5 and x+5 is 0.5, and, in Comparative Example 3, the difference between slopes of tangents to the curve at x−5 and x+5 is greater than 0.5. From the results, an increase in resistance or deterioration of lifespan characteristics may be predicted due to over-compression of the negative electrode having an electrode density exceeding the electrode density of the case of Example 7.

Experimental Example 2: Evaluation of Battery Characteristics Via Final Negative Electrode Thickness and Initial Efficiency The thicknesses of the negative electrode of each of the coin-type half secondary batteries (CHC) of Examples 1 to 7 and Comparative Examples 1 to 3 before and after the 1$^{st}$ full charging cycle were measured.

In addition, after the 1$^{st}$ full charging cycle, each battery was discharged at a constant current (CC) of 0.2 C until the voltage reached 1.0 V, and then initial efficiency of each battery was measured and the results thereof are shown in Table 2 below

TABLE 2

| Type of negative electrode sample | Initial thickness of negative electrode (µm) | Final thickness of negative electrode (µm) | Initial efficiency of CHC (%) | Discharge capacity (mAh) |
|---|---|---|---|---|
| Example 1 | 72 | 98.0 | 93.8 | 5.67 |
| Example 2 | 72 | 98.0 | 93.8 | 5.68 |
| Example 3 | 72 | 97.5 | 93.2 | 5.59 |
| Comparative Example 1 | 72 | 94.0 | 92.0 | 5.41 |
| Comparative Example 2 | 72 | 94.0 | 91.5 | 5.33 |
| Example 4 | 72 | 96.0 | 94.1 | 5.69 |
| Example 5 | 72 | 96.0 | 94.0 | 5.68 |
| Example 6 | 72 | 94.5 | 94.0 | 5.68 |
| Example 7 | 72 | 94.0 | 93.5 | 5.61 |
| Comparative Example 3 | 72 | 93.0 | 92.2 | 5.39 |

As shown in Table 2, when examining initial efficiency characteristics of the cases of Examples 1 to 3 and Comparative Examples 1 and 2 in which graphite having a low degree of graphitization and consisting of secondary particles as an active material is used, the cases of Examples 1 and 2 exhibit the highest initial efficiency, and the cases of Comparative Examples 2 and 3 exhibit similar initial efficiency, i.e., a difference of 0.5% p. Furthermore, even when examining the thicknesses of the negative electrodes, the cases of Examples 1 and 2 exhibit the lowest negative electrode expansion characteristics, and the cases of Comparative Examples 1 and 2 exhibit equal negative electrode expansion characteristics, from which it can be confirmed that electrode density points at which the final thicknesses and initial efficiency characteristics are rapidly changed are similar to each other.

Generally, in secondary batteries, swelling characteristics of a negative electrode are determined based on a full layer thickness, and thus, when less swelling occurs, it is determined that a secondary battery has excellent performance. However, referring to Table 2, the discharge capacity tends to decrease according to an increase in pressing density. This indicates that initial efficiency is decreased due to decreased discharge capacity in spite of the same charge capacity, and, as the pressing density increases, the absolute amount of an active material participating in the overall battery reaction is decreased, resulting in low swelling characteristics. Accordingly, the secondary batteries of Examples 1 to 7 exhibit higher initial efficiencies than those of the secondary batteries of Comparative Examples 1 to 3 having relatively high swelling characteristics.

From the results, it can be confirmed that the negative electrodes using graphite having a low degree of graphitization and consisting of secondary particles as an active material and having both excellent initial efficiency and excellent expansion characteristics have an electrode density in the range between the electrode densities of Examples 1 and 3. As in the above examples, the difference between slopes of tangents to the expansion curve according to the SOC is shown as 0.5 or less, and it can be seen that these results support that the electrode density in the range between the electrode densities of Examples 1 and 3 is an optimum electrode density.

In addition, as a result of examining initial efficiency characteristics of the secondary batteries of Examples 5 to 7 and Comparative Example 3 in which graphite having a high degree of graphitization and consisting of secondary particles as an active material is used, it can be confirmed that the secondary batteries of Examples 5 to 7 exhibit similar initial efficiencies, while the secondary battery of Comparative Example 3 exhibits rapidly deteriorated initial efficiency characteristics.

From the results, it can be confirmed that the negative electrodes using graphite having a high degree of graphitization and consisting of secondary particles as an active material and having both excellent initial efficiency and excellent expansion characteristics have an electrode density in the range between the electrode densities of Examples 4 and 7. As in the above examples, the difference between slopes of tangents to the expansion curve according to the SOC is shown as 0.5 or less, and it can be seen that these results support that the electrode density in the range between the electrode densities of Examples 4 and 7 is an optimum electrode density.

Experimental Example 3: Evaluation of Lifespan Characteristics of Battery

Lifespan characteristics according to cycle of each of the secondary batteries of Examples 2, 4, and 6, and Comparative Examples 1 to 3 were evaluated.

Figure 2:
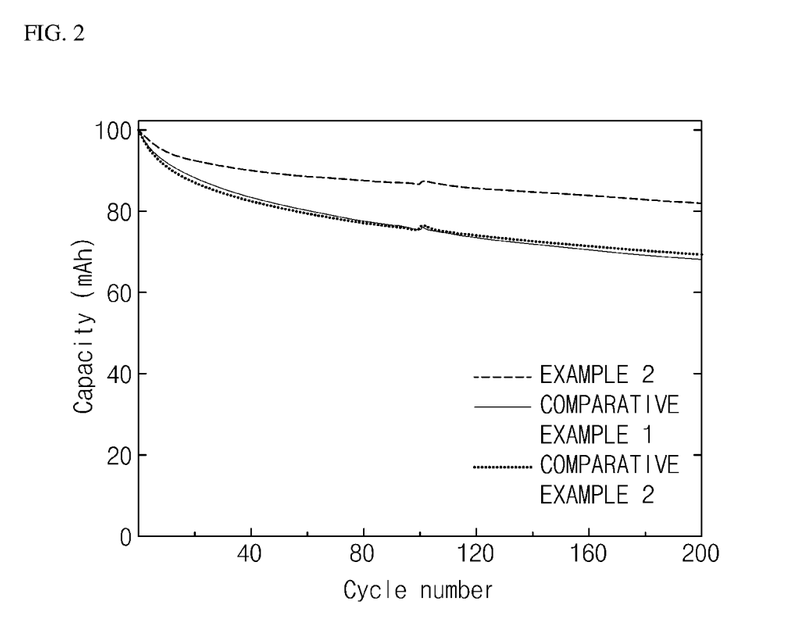
FIG. 2 is a graph showing capacity characteristics according to the number of cycles of each of the negative electrode samples of Example 2 and Comparative Examples 1 and 2.
Figure 3:
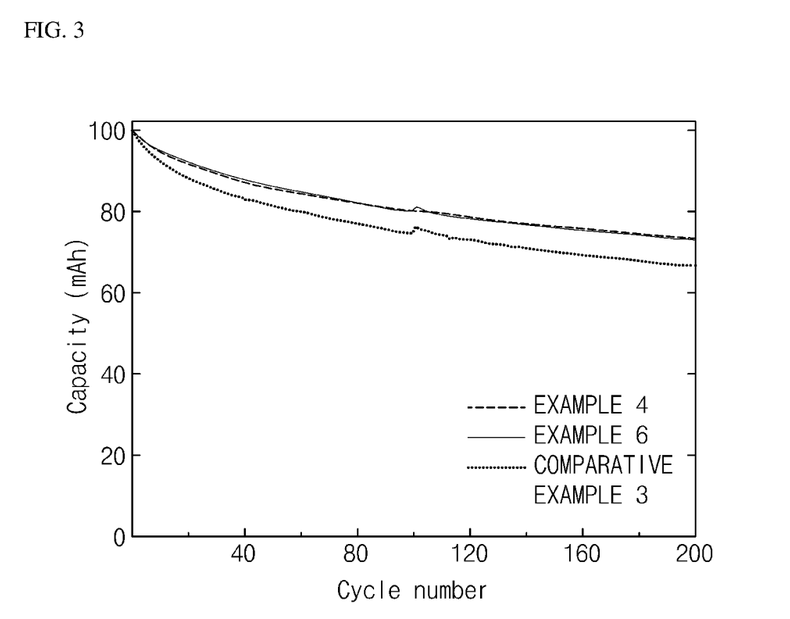
FIG. 3 is a graph showing capacity characteristics according to the number of cycles of each of the negative electrode samples of Examples 4 and 6, and Comparative Example 3.

In particular, capacity characteristics according to cycle of the secondary batteries of Example 2, and Comparative Examples 1 and 2 including graphite having a low degree of graphitization and consisting of secondary particles as a negative electrode active material were compared with those of the secondary batteries of Examples 4 and 6, and Comparative Example 3 including graphite having a high degree of graphitization and consisting of secondary particles as a negative electrode active material, and the results thereof are shown in FIGS. 2 and 3.

In particular, each of the secondary batteries of Examples 2, 4, and 6 and Comparative Examples 1 to 3, having a battery capacity of 30 mAh, was charged at a constant current of 1 C until the voltage reached 4.4 V at 25° C., and then charged at a constant voltage of 4.4 V, and the charging was cut off when the charging current reached 1.5 mA. Subsequently, each lithium secondary battery was allowed to stand for 10 minutes, and then discharged at a constant current of 0.5 C until the voltage reached 3 V. This charging/discharging process is denoted as 1 cycle, and this cycle was repeated 200 times, and then capacities according to cycle of the examples and the comparative examples were measured.

As illustrated in FIG. 2, in the secondary batteries including graphite having a low degree of graphitization and consisting of secondary particles as a negative electrode active material, while the cycle was repeated 200 times, the secondary battery of Example 2 exhibited significantly superior cycle characteristics to those of the secondary batteries of Comparative Examples 1 and 2. As shown in Experimental Example 1, this is because, in the case of Example 2, assuming that an SOC value, at which the slope of a tangent to the negative electrode expansion curve according to the SOC at the $1^{st}$ charging cycle is 1 at the SOC of less than 50%, is x, a difference between slopes of tangents to the curve at x−5 and x+5 satisfies the value of 0.5 or less, and thus the secondary battery of Example 2 has an optimum electrode density.

Meanwhile, FIG. 3 is a graph showing changes in capacity of the secondary batteries including graphite having a high degree of graphitization and consisting of secondary particles as a negative electrode active material while the cycle was repeated 200 times. As shown in FIG. 3, the secondary batteries of Examples 4 and 6 exhibited superior cycle characteristics to those of the secondary battery of Comparative Example 3. As shown in Experimental Example 1, this is because, in the cases of Examples 4 and 6, assuming that an SOC value, at which the slope of a tangent to the negative electrode expansion curve according to the SOC at the 1st charging cycle is 1 at the SOC of less than 50%, is x, a difference between slopes of tangents to the curve at x−5 and x+5 satisfies the value of 0.5 or less, and thus the secondary batteries of Examples 4 and 6 have optimum electrode densities.

While exemplary embodiments of the present invention have been described in detail, these embodiments are not intended to limit the scope of the present invention. In addition, various changes and modifications made by those of ordinary skill in the art using the basic concepts of the present invention as defined by the following claims should be construed as being within the scope of the present invention.

The invention claimed is:

1. A method of manufacturing a negative electrode, the method comprising:
    fabricating a plurality of negative electrode samples, each negative electrode sample having an active layer of the same composition and a different electrode density, wherein each active material layer includes graphite as an active material;
    measuring expansion of each negative electrode sample as a function of a state of charge (SOC) during a $1^{st}$ charging cycle to generate an expansion curve for each negative electrode sample;
    determining an SOC value, x, at which a slope of a tangent line to the expansion curve is 1, wherein x<50% for each negative electrode sample;
    determining a slope of a tangent line to the expansion curve at an SOC value of x−5, and a slope of a tangent line to the expansion curve at an SOC value of x+5 for each negative electrode sample;
    determining a difference between the slopes of the tangent lines at x−5 and x+5 for each negative electrode sample;
    selecting the negative electrode samples having a difference between the slopes of the tangent lines at x−5 and x+5 in a range of 0 to 0.5; and
    manufacturing a negative electrode under the same conditions as one of the selected negative electrode samples.

2. The method of claim 1, wherein the graphite having a powder compact density ranging from 1.75 g/cc to 1.95 g/cc and consisting of secondary particles as an active material.

3. The method of claim 1, wherein the active material layer comprises the graphite, a conductive material, and a binder in a weight ratio of 95-95.5:0.5-1.5:3.5-4.

4. The method of claim 1, wherein, each negative electrode sample has an electrode density ranging from 1.3 g/cc to 1.8 g/cc.

5. The method of claim 1, wherein the manufactured negative electrode is performed by applying a slurry on a current collector, wherein the slurry is a mixture of graphite, a conductive material, a binder, and an organic solvent; and then drying and pressing the resulting negative active material layer against the current collector,
    wherein the pressing is performed to achieve an electrode density that is the same as the electrode density of the selected negative electrode sample.

6. A negative electrode manufactured using the method of claim 1,
    wherein the manufactured negative electrode comprises graphite consisting of secondary particles as an active material and has an electrode density of 1.3 g/cc to 1.5 g/cc.

7. A negative electrode manufactured using the method of claim 1, wherein the manufactured negative electrode comprises graphite consisting of secondary particles as an active material and has an electrode density of 1.4 g/cc to 1.7 g/cc.

8. The negative electrode according to claim 6, wherein a weight ratio of the graphite, a conductive material, and a binder in the manufactured negative electrode is 95-95.5:0.5-1.5:3.5-4.

9. A secondary battery comprising the manufactured negative electrode of claim 6, a positive electrode, a separator between the negative electrode and the positive electrode, and an electrolyte.

10. The negative electrode according to claim 7, wherein a weight ratio of the graphite, a conductive material, and a binder in the manufactured negative electrode is 95-95.5:0.5-1.5:3.5-4.

11. A secondary battery comprising the manufactured negative electrode of claim 7, a positive electrode, a separator between the negative electrode and the positive electrode, and an electrolyte.

* * * * *